(12) United States Patent
Liang et al.

(10) Patent No.: US 11,735,518 B2
(45) Date of Patent: Aug. 22, 2023

(54) DUAL-MODE WIRELESS CHARGING DEVICE

(71) Applicant: Taiwan Semiconductor Manufacturing Co., Ltd., Hsin-Chu (TW)

(72) Inventors: Shih-Wei Liang, Dajia Township, Taichung County (TW); Hung-Yi Kuo, Taipei (TW); Hao-Yi Tsai, Hsinchu (TW); Ming-Hung Tseng, Toufen Township, Miaoli County (TW); Hsien-Ming Tu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 841 days.

(21) Appl. No.: 16/671,644

(22) Filed: Nov. 1, 2019

(65) Prior Publication Data
US 2020/0066635 A1    Feb. 27, 2020

Related U.S. Application Data

(62) Division of application No. 15/222,815, filed on Jul. 28, 2016, now Pat. No. 10,497,646.

(51) Int. Cl.
*H01F 27/28* (2006.01)
*H01L 23/522* (2006.01)
(Continued)

(52) U.S. Cl.
CPC ......... *H01L 23/5227* (2013.01); *H01F 41/04* (2013.01); *H01F 41/061* (2016.01);
(Continued)

(58) Field of Classification Search
CPC ............. H01L 23/5227; H01L 23/3157; H01L 23/49822; H01L 23/5223; H01L 23/5226; H01L 23/528; H01L 23/66; H01L 28/10; H01L 28/40; H01L 23/5389; H01L 24/20; H01L 2223/6655; H01L 2223/6672; H01L 2223/6677; H01L 2224/04105;
(Continued)

(56) References Cited

U.S. PATENT DOCUMENTS 6,198,374 B1     3/2001   Abel
7,764,158 B2 *   7/2010   Kubono ................. H01F 38/14
                                                          336/200
(Continued)

*Primary Examiner* — Mang Tin Bik Lian
(74) *Attorney, Agent, or Firm* — Duane Morris LLP

(57) ABSTRACT

A method of making a semiconductor device, includes: forming a first molding layer on a substrate; forming a first plurality of vias in the first molding layer; forming a first conductive line over the first molding layer, wherein the first conductive line is laterally disposed over the first molding layer and a first end of the conductive line aligns with and is electrically coupled to a first via of the first plurality of vias; forming a second molding layer above the first molding layer; and forming a second plurality of vias in the second molding layer, wherein a second via of the second plurality of vias aligns with and is electrically coupled to a second end of the conductive line, and wherein the second plurality of vias, the conductive line, and the first plurality of vias are electrically coupled to one another.

20 Claims, 16 Drawing Sheets

(51) Int. Cl.
*H01L 23/66* (2006.01)
*H01L 23/498* (2006.01)
*H01F 41/04* (2006.01)
*H01F 41/061* (2016.01)
*H02J 50/12* (2016.01)
*H01L 23/31* (2006.01)
*H01L 23/528* (2006.01)
*H01L 49/02* (2006.01)
*H01L 23/538* (2006.01)
*H01L 23/00* (2006.01)
*H01F 41/12* (2006.01)

(52) U.S. Cl.
CPC .... *H01L 23/3157* (2013.01); *H01L 23/49822* (2013.01); *H01L 23/528* (2013.01); *H01L 23/5223* (2013.01); *H01L 23/5226* (2013.01); *H01L 23/66* (2013.01); *H01L 28/10* (2013.01); *H01L 28/40* (2013.01); *H02J 50/12* (2016.02); *H01F 41/122* (2013.01); *H01L 23/5389* (2013.01); *H01L 24/20* (2013.01); *H01L 2223/6655* (2013.01); *H01L 2223/6672* (2013.01); *H01L 2223/6677* (2013.01); *H01L 2224/04105* (2013.01); *H01L 2224/24195* (2013.01); *H01L 2224/32225* (2013.01); *H01L 2224/73267* (2013.01); *H01L 2924/19041* (2013.01); *H01L 2924/19042* (2013.01); *H01L 2924/19105* (2013.01)

(58) Field of Classification Search
CPC . H01L 2224/24195; H01L 2224/32225; H01L 2224/73267; H01L 2924/19041; H01L 2924/19042; H01L 2924/19105; H01F 41/04; H01F 41/061; H01F 41/122; H02J 50/12
See application file for complete search history.

(56) References Cited

U.S. PATENT DOCUMENTS

| | | | |
|---|---|---|---|
| 8,466,537 | B1* | 6/2013 | Papou ............... H01F 41/046 257/E21.022 |
| 2002/0036335 | A1* | 3/2002 | Minami ............ H01F 17/0006 257/E21.022 |
| 2004/0056749 | A1* | 3/2004 | Kahlmann ............ H01L 27/08 336/200 |
| 2004/0095222 | A1 | 5/2004 | Liang |
| 2004/0104449 | A1* | 6/2004 | Yoon ................ H01F 17/0013 438/106 |
| 2004/0140528 | A1* | 7/2004 | Kim ..................... H01F 21/12 257/E21.022 |
| 2007/0090912 | A1* | 4/2007 | Lee ....................... H05K 1/165 336/200 |
| 2009/0134490 | A1 | 5/2009 | Furukawa |
| 2013/0043968 | A1 | 2/2013 | Cho |
| 2013/0087921 | A1* | 4/2013 | Wahl ..................... H01L 24/19 257/773 |
| 2013/0093045 | A1 | 4/2013 | Cho |
| 2014/0036464 | A1 | 2/2014 | Kilger |
| 2015/0364241 | A1 | 12/2015 | Groves |
| 2017/0083804 | A1* | 3/2017 | Kato ............... G06K 19/07786 |

* cited by examiner

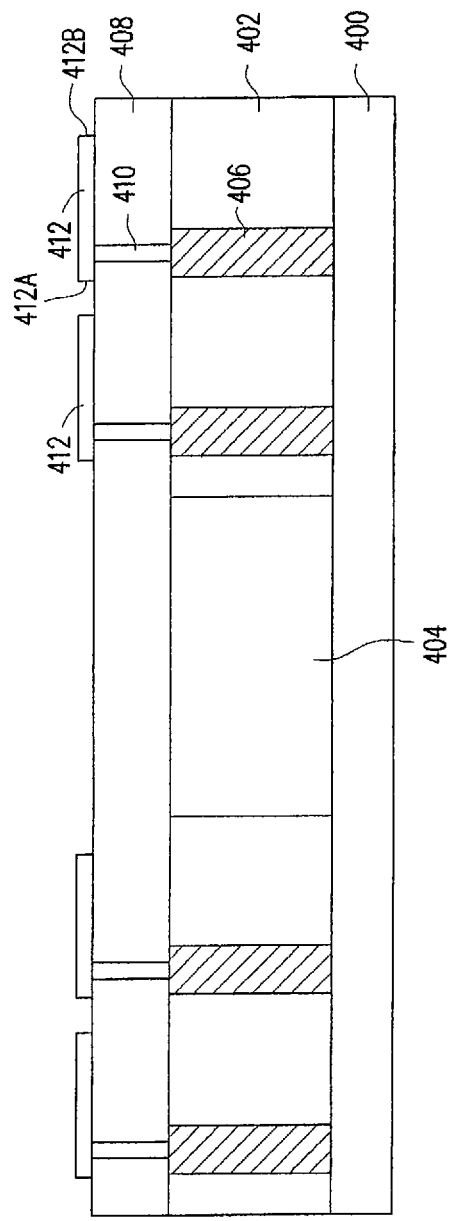

DUAL-MODE WIRELESS CHARGING DEVICE

CROSS-REFERENCE TO RELATED APPLICATION

This application is a divisional of U.S. patent application Ser. No. 15/222,815, filed Jul. 28, 2016, which is incorporated by reference herein in its entirety.

BACKGROUND

Typically, powered devices such as a wireless electronic devices require a wired charger and power source, which is usually an alternating current (AC) power outlet. Approaches are being developed that use over-the-air or wireless power transmission between a transmitter and a receiver coupled to the electronic device to be powered. In general, the transmitter uses an antenna or a coupling device to wirelessly transmit energy by means of electromagnetic fields and/or waves such as, for example, electric fields, magnetic fields, radio waves, microwaves, or infrared or visible light waves. The receiver uses another antenna or coupling device to, wirelessly, collect the energy provided by the transmitter.

Depending on a distance between the transmitter and the receiver while the receiver is still able to effectively collect wireless energy from the transmitter, a wireless power transmission system (i.e., a transmitter and a receiver) may be categorized into two major groups: a near-field wireless power transmission system and a far-field wireless power transmission system. The near-field wireless power transmission system generally requires the receiver (the transmitter) to be relatively close or near to the transmitter (the receiver); the far-field wireless power transmission system generally allows the receiver (the transmitter) to be further away from the transmitter (the receiver) when compared to near-field systems. Since the technologies to wirelessly transmit power in the near-field and far-field wireless power transmission systems are essentially different, each of the systems has its respective advantages/disadvantages over the other.

BRIEF DESCRIPTION OF THE DRAWINGS

FIGS. 4A, 4B, 4C, 4D, 4E, 4F, 4G, 4H, 4I, 4J, 4K illustrate cross-sectional views of the coupling device of FIG. 2 at various fabrication stages, in accordance with some embodiments of the present disclosure.

DETAILED DESCRIPTION OF EXEMPLARY EMBODIMENTS

Figure 1:
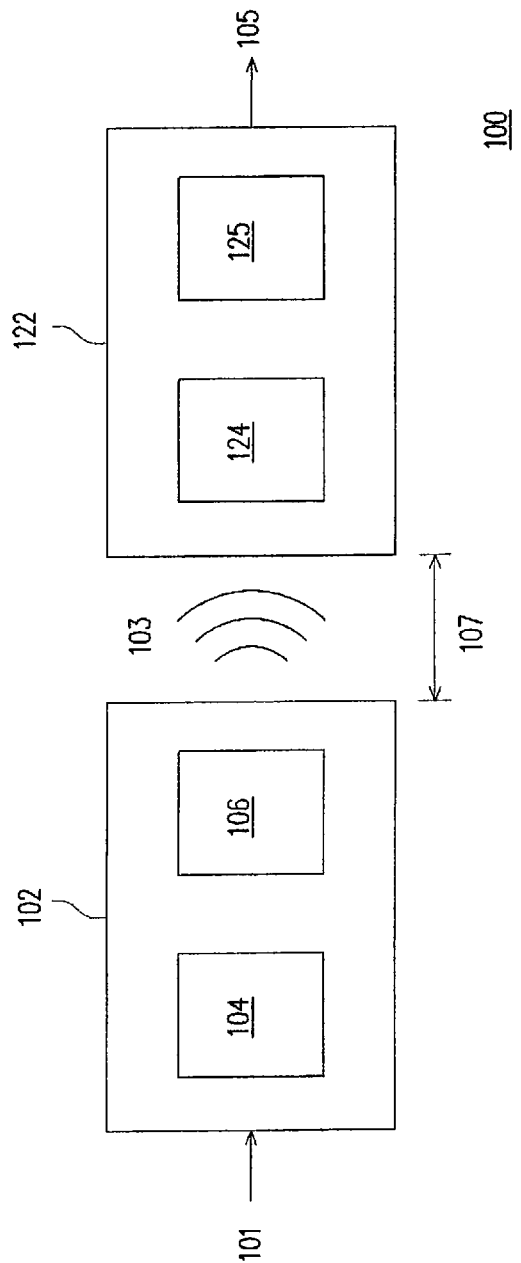
FIG. 1 illustrates an exemplary block diagram of a wireless power transfer system, in accordance with various embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

The term "wireless power" is used herein to mean any form of energy associated with electric fields, magnetic fields, electromagnetic fields, electromagnetic radiation, or otherwise that is transmitted from a transmitter to a receiver without the use of physical electromagnetic conductors. Generally, one of the underlying principles of wireless energy transfer includes magnetic coupled resonance (i.e., resonant induction or magnetic resonance (MR)) using frequencies, for example, below 30 MHz). The MR uses magnetically coupled electromagnetic field(s) to transfer wireless power and can allow a transmitter to wirelessly transfer power to a receiver over a short-range distance (e.g., about a few centimeters to several meters), or up to a mid-range distance (e.g., about several to 1 meters). Thus, systems using MR to wirelessly transmit and/or receive power are typically categorized as near-field wireless power transfer systems.

Another principle of wireless energy transfer includes using electromagnetic radiation. The electromagnetic radiation can be formed into beam(s) by means of reflection and/or refraction. As such, a transmitter/receiver of a wireless power transfer system using electromagnetic radiation may transmit/collect wireless power by means of a respective antenna, which allows power to be wirelessly transferred over a farther (e.g., a long-range) distance (e.g., greater than 1 meters). Thus, systems using electromagnetic radiation to wirelessly transmit/receive power are typically categorized as far-field wireless power transfer systems.

The present disclosure provides various embodiments of a wireless power transfer system that can be used in both near-field and far-field applications, and various embodiments of methods to fabricate such a wireless power transfer system. Further, in some embodiments, one or more structures of the wireless power transfer system can be formed by using existing CMOS fabrication technologies. Therefore, in some embodiments, fabricating a wireless power transfer system, capable of both near-field and far-field energy transfer, can be seamlessly integrated into existing CMOS fabrication steps. Still further, in some embodiments, one or more structures of the wireless power transfer system may be formed in an integrated fan-out (InFO) structure, which allows more flexibility for integrating such one or more structure(s) with other active/passive device elements such as, for example, an energy harvester, as discussed in further detail below.

FIG. 1 illustrates an exemplary block diagram of a wireless power transfer system 100 in accordance with some embodiments. As illustrated, the system 100 includes a transmitter 102 and a receiver 122, wherein wireless power 103 is transmitted from the transmitter 102 to the receiver 122 over a distance 107. The transmitter 102 includes an input 101 configured to receive power from an external power source (e.g., an alternative current (AC) power source) and thereafter provide wireless power 103, which is transmitted to the receiver 122. Upon receiving the wireless power 103, the receiver 122 may use the wireless power 103 to provide output power 105 to a coupled device for storage and/or consumption (e.g., a battery, a portable device including the receiver 122, an energy harvesting device, etc.).

Referring still to FIG. 1, in some embodiments, the transmitter 102 includes a processing unit 104, and a coupling unit 106 coupled to the processing unit 104. The receiver 122 includes a coupling unit 124, and a conversion unit 125 coupled to the coupling unit 124. According to some embodiments, the processing unit 104 may include at least one of a variety of circuits/components that are configured to receive power from external power source and thereafter process (e.g., amplify, filter, etc.) the input power to drive the coupling device 106. For example, the variety of circuits may include: an oscillation circuit, a power amplifier, a voltage converter, or a combination thereof. Regarding the coupling device 106 of the transmitter 102, it may include a capacitive coupling electrode, an inductive coupling coil, a resonant inductive coil, an antenna, or a combination thereof. Typically, capacitive coupling electrodes, inductive coupling coils, and/or resonant inductive coils are used to induce the wireless power 103 to be transmitted in near-field applications, while antenna are typically used to induce the wireless power 103 to be transmitted in far-field applications. In some embodiments, the coupling device 106 is driven by the processing unit 104 and uses one of the principles described above (e.g., electromagnetic fields, electromagnetic radiation, etc.) to transmit the power 103 wirelessly to the receiver 122.

The coupling device 124 of the receiver 122 is configured to couple with the coupling device 106 of the transmitter 102 (e.g., via an electromagnetic field and/or electromagnetic radiation) so as to allow the power 103 to be transmitted to and received by coupling device 124 of the receiver 122. In one embodiment, the coupling device 106 includes a resonant inductive coil, and the coupling device 124 also includes a resonant inductive coil so that the power 103 may be transmitted over the distance 107 to the coupling device 124 wirelessly by using a coupled inductive resonance between the coupling devices 106 and 124. In another embodiment, the coupling device 106 includes an antenna to form a radiative beam (i.e., electromagnetic radiation), and the coupling device 124, in addition to the resonant inductive coil, also includes an antenna so that the power 103 may be transmitted via the radiative beam and collected (i.e., received) by the antenna of the coupling device 124. In response to the power 103 being received by the coupling device 124, the conversion unit 125 converts the power 103 to output power 105. In some embodiments, the conversion unit 125 may include a voltage converter, for example, an alternative current to direct current (AC-DC) converter. Thus, in some embodiments, the output power 105 may be a DC power signal.

Figure 2:
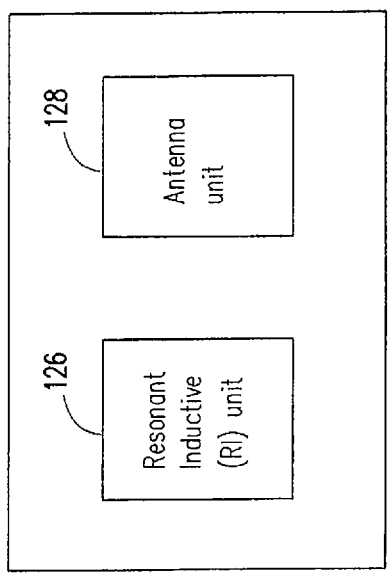
FIG. 2 illustrates an exemplary block diagram of a coupling device of a receiver of the wireless power transfer system of FIG. 1, in accordance with various embodiments.

FIG. 2 illustrates an exemplary block diagram of the coupling device 124 in accordance with some embodiments. In the illustrated embodiment of FIG. 2, the coupling device 124 includes a resonant inductive (RI) unit 126 and an antenna unit 128. In some embodiments, the RI unit 126 and antenna unit 128 may be physically distinct from but (electrically and/or magnetically) coupled with each other while, in some other embodiments, the RI unit 126 and antenna unit 128 may be physically overlapped with each other. In some embodiments, the RI unit 126 is configured to be used in the near-field application, and the antenna unit 128 is configured to be used in the far-field application. That is, as described above, the RI unit 126 may use a resonant inductive coil to receive wireless power, and the antenna unit 128 may use an antenna to receive wireless power. The RI unit 126 and the antenna unit 128 will be discussed in further detail below.

Figure 3:
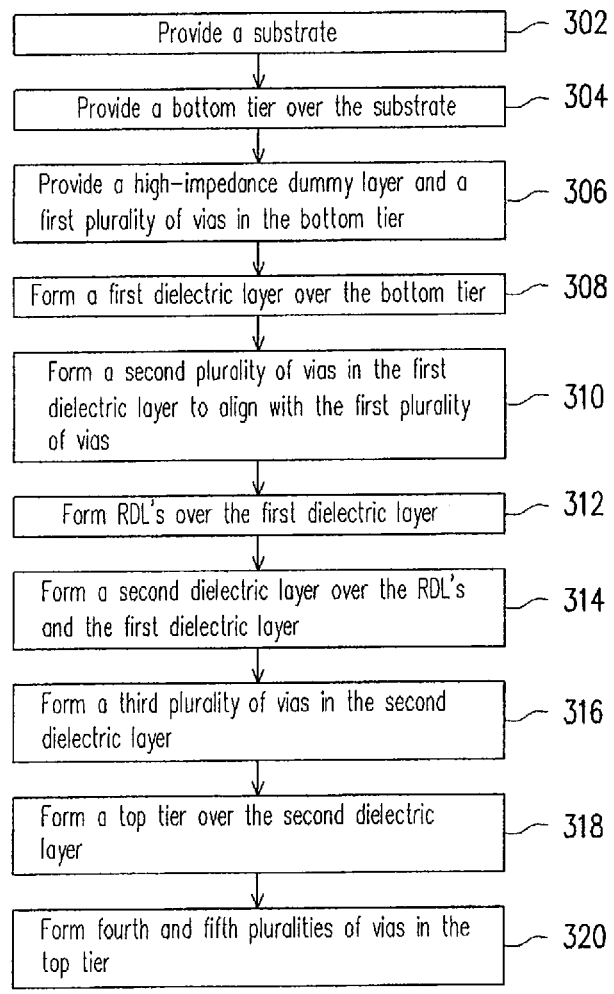
FIG. 3 illustrates a flow chart of a method to fabricate the coupling device of FIG. 2, in accordance with various embodiments

Referring now to FIG. 3, a flow chart of a method 300 of making the coupling device 124 (e.g., the RI unit 126 and the antenna unit 128) is illustrated according to various aspects of the present disclosure. The method 300 is merely an example, and is not intended to limit the present disclosure. Additional operations can be provided before, during, and after the method 300, and some of the described operations can be replaced, eliminated, or changed in sequence, in accordance with further embodiments of the method.

The method 300 is described below in conjunction with FIGS. 4A, 4B, 4C, 4D, 4E, 4F, 4G, 4H, 4I, 4J, and 4K, which illustrate cross-sectional views of portions of the coupling device 124 at various fabrication stages. The coupling device may be an intermediate device fabricated during processing and/or packaging of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 4A:
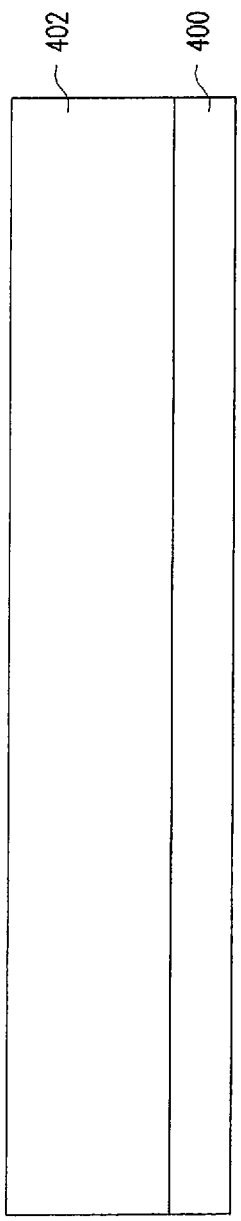

Referring now to FIG. 3 and FIG. 4A, the method 300 starts at operation 302 in which substrate 300 is provided, then continues to operation 304 in which bottom tier 402 is formed over the substrate 400.

In some embodiments, the substrate 400 may be implemented as a package substrate or a device substrate. In the example of the substrate 400 being implemented as a package substrate, the package substrate 400 may be implemented in a variety of ways that are operable to provide a real estate for component(s) formed above. For example, the package substrate 400 may comprise a die lead frame, a printed circuit board (PCB), a multiple chip package substrate or other types of substrates. While the substrate 400 being implemented as a device substrate, the device substrate 400 may comprise one or more microelectronic/nanoelectronic devices, such as transistors, electrically programmable read only memory (EPROM) cells, electrically erasable programmable read only memory (EEPROM) cells, static random access memory (SRAM) cells, dynamic random access memory (DRAM) cells and other microelectronic devices, which may be interconnected to form one or more integrated circuits. The device substrate 400 contemplates one or more substrates on or in which one or more conventional or future-developed microelectronic/nanoelectronic devices may be formed. The bulk of the substrate 400 (either a package substrate or a device substrate) may be a silicon-on-insulator (SOI) substrate and/or may comprise silicon, gallium arsenide, strained silicon, silicon germanium, carbide, diamond and other materials.

Referring still to FIG. 4A, in some embodiments, the bottom tier 402 includes a molding material. Such a molding material may be formed over the substrate 400 by a spin-on coating method, a deposition method (e.g., ALD, CVD, PVD), etc. In some embodiments, the molding material of the bottom tier 402 may be selected from: an epoxy molding compound (EMC) material, a molded underfill (MUF) material, an ammonium biflouride (ABF) material, an ABF-based material, a resin material, or a combination thereof. In some embodiments, the bottom tier 402 may have a thickness that is about 50~200 micrometers µm while any desired thickness of the bottom tier 402 may be used in other embodiments.

Figure 4B:
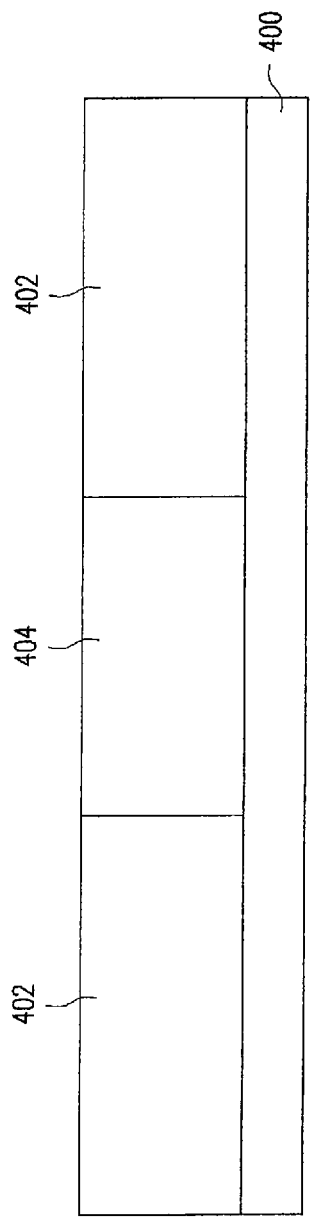
Figure 4C:
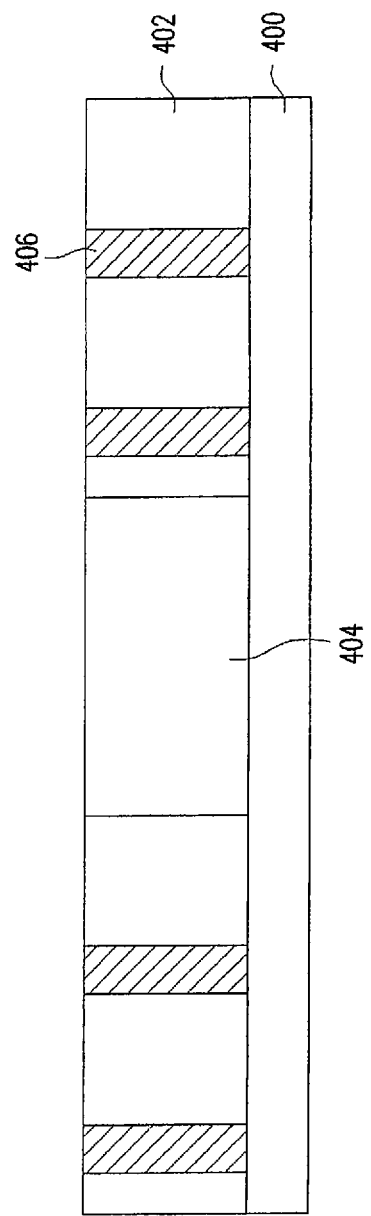

Referring back to FIG. 3, the method 300 continues to operation 306 in which a high-impedance dummy layer 404 is formed in the bottom tier 402 (FIG. 4B) and a first plurality of vias 406 are (subsequently) formed in the bottom tier 402 (FIG. 4C). Referring first to FIG. 4B, in accordance with some embodiments, the high-impedance dummy layer 404 may be formed of a high resistivity silicon or polysilicon. In some embodiments, the high-impedance dummy layer 404 may be formed by using at least one of the following process steps: forming a first patterned mask layer over the bottom tier 402; using the first patterned mask layer to selectively etch the bottom tier 402 thereby forming a recess in the bottom tier 402; filling the recess with the high-resistivity silicon by using CVD, PVD, ALD, ECD, MBE, or the like; removing the first patterned mask layer; and cleaning.

Referring now to FIG. 4C, in some embodiments (after the high-impedance dummy layer 404 is formed), the vias 406 are formed (still at operation 306 of FIG. 3). Such vias 406 may be formed of a conductive material, for example, copper (Cu), nickel (Ni), platinum (Pt), aluminum (Al), lead-free solder (e.g., SnAg, SnCu, SnAgCu), or a combination thereof. In some embodiments, the via 406 has a height that is essentially similar to the thickness of the bottom tier 402, for example, about 50~200 µM. Subsequently, the first plurality of vias 406 may be formed by using at least one of the following process steps: forming a second patterned mask layer over the bottom tier 402 that defines a dimension (e.g., a width of the via 406), and a location of the vias 406 (e.g., next to the high-impedance dummy layer 404); using the second patterned mask layer to selectively etch the bottom tier 402 thereby forming a first plurality of openings in the bottom tier 402; filling the first plurality of openings with the conductive material as described above by using PVD, CVD, ECD, MBE, ALD, or the like; removing the second patterned mask layer; polishing out excessive conductive material on a top surface of the bottom tier 402; cleaning.

Figure 4D:
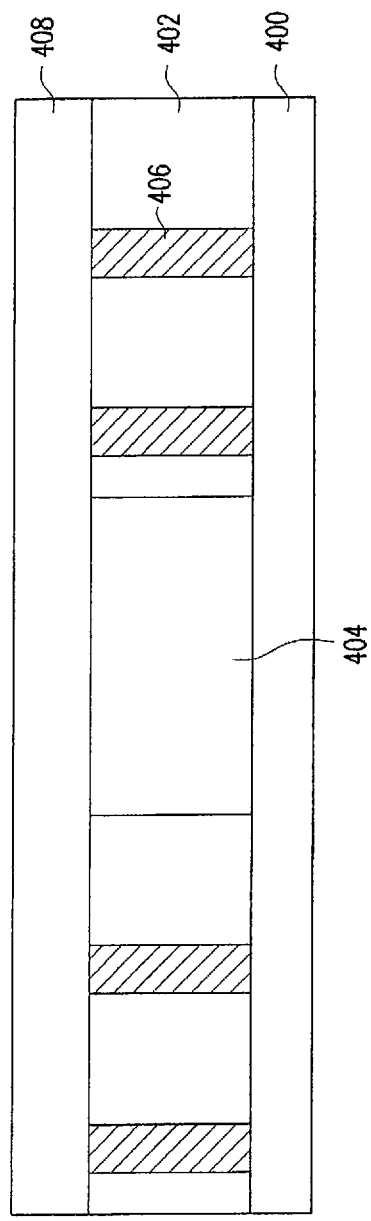

Referring back to FIG. 3, the method 300 continues to operation 308 in which a first dielectric layer 408 is formed over the bottom tier 402 (FIG. 4D). In some embodiments, the first dielectric layer 408 is formed of a material that is selected from: a polymide, a polybenzoxazole (PBO), a PBO-based dielectric material, a benzocyclobutene (BCB), a BCB-based dielectric material, or a combination thereof. In some embodiments, the first dielectric layer 408 may have a thickness that is about 4~7 (µm), while any desired thickness of the first dielectric layer 408 may be used for other embodiments. In some embodiments, the first dielectric layer 408 may be formed by using PVD, CVD, ECD, MBE, ALD, or the like.

Figure 4E:
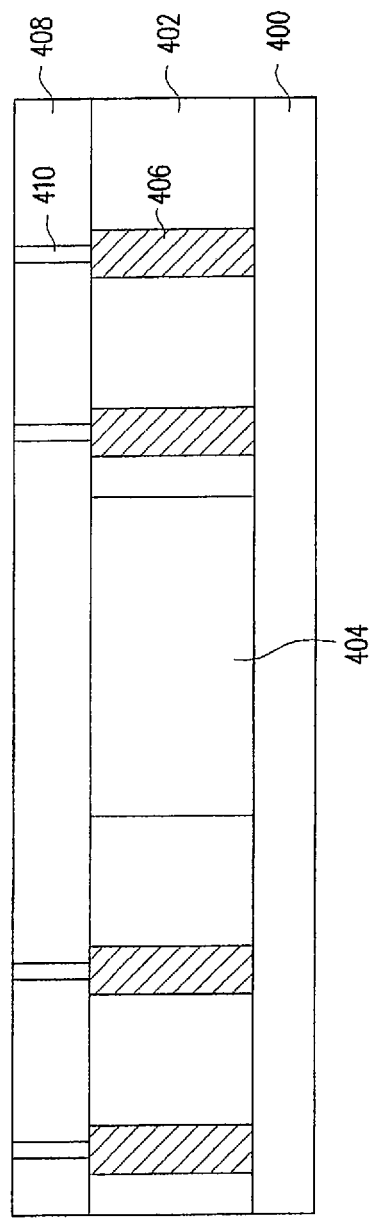
Figure 4G:
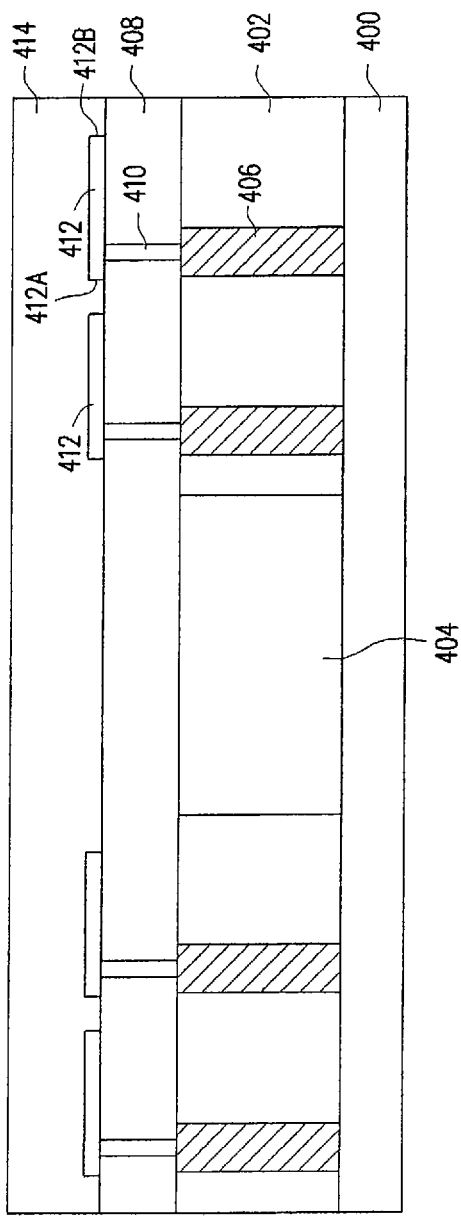

Referring still to FIG. 3, the method 300 continues to operation 310 in which a second plurality of vias 410 are formed in the first dielectric layer 408 (FIG. 4E). In some embodiments, the vias 410 may be formed of a conductive material, for example, copper (Cu), nickel (Ni), platinum (Pt), aluminum (Al), lead-free solder (e.g., SnAg, SnCu, SnAgCu), or a combination thereof. In some embodiments, each of the vias 410 is formed to be aligned with one of the first plurality of vias 406, as shown in the illustrated embodiment of FIG. 4E. In some embodiments, the vias 410 may be formed by using at least one of the following process steps: forming a third patterned mask layer over the first dielectric layer 408 that defines a dimension (e.g., a width of the via 410), and a location of the via 410 (e.g., to be aligned with the via 406); using the third patterned mask layer to selectively etch the first dielectric layer 408 thereby forming a second plurality of openings in the first dielectric layer 408; filling the second plurality of openings with the conductive material as described above by using PVD, CVD, ECD, MBE, ALD, or the like; removing the third patterned mask layer; polishing out excessive conductive material on a top surface of the first dielectric layer 408; cleaning.

Referring now to FIG. 3 and in conjunction with FIG. 4F, the method 300 continues to operation 312 in which RDL's 412 are formed over the first dielectric layer 408. In some embodiments, the RDL 412 is formed to cause one end (e.g., 412A) of the RDL 412 to be aligned with the via 410 of the first dielectric layer 408 and the other end (e.g., 412B) of the RDL layer 412 to align with a subsequently formed via (416).

Referring still FIG. 4F, the RDL 412 may be formed of a conductive material, for example, copper (Cu), nickel (Ni), platinum (Pt), aluminum (Al), lead-free solder (e.g., SnAg, SnCu, SnAgCu), or a combination thereof. In some embodiments, the RDL 412 may have a width about 50~1000 µm. In some embodiments, the RDL 412 may be formed by using at least one of the following process steps: forming a dummy dielectric layer over the first dielectric layer 408; forming a fourth patterned mask layer over the dummy dielectric layer that defines a dimension (e.g., the width of the RDL 412), and a location of the RDL 412 (e.g., to cause the end 412A to be aligned with the via 406); using the fourth patterned mask layer to selectively etch the dummy dielectric layer thereby forming a third plurality of openings in the dummy dielectric layer; filling the third plurality of openings with the conductive material as described above by using PVD, CVD, ECD, MBE, ALD, or the like; removing the fourth patterned mask layer and the dummy dielectric layer; cleaning.

Referring back to FIG. 3, the method 300 continues to operation 314 in which a second dielectric layer 414 is formed over the first dielectric layer 408 and the RDL 412 (FIG. 4G). the second dielectric layer 408 is formed over the first dielectric layer 406. In some embodiments, the second dielectric layer 414 is formed of a material that is selected from: a polymide, a polybenzoxazole (PBO), a PBO-based dielectric material, a benzocyclobutene (BCB), a BCB-based dielectric material, or a combination thereof. That is, in some embodiments, the second dielectric layer 414 may include a material that is substantially similar to the first dielectric layer 408. In some embodiments, the second dielectric layer 414 may have a thickness that is about 4~7 µm, while any desired thickness of the second dielectric layer 414 may be used for other embodiments. In some embodiments, the second dielectric layer 414 may be formed by using PVD, CVD, ECD, MBE, ALD, or the like.

Figure 4H:
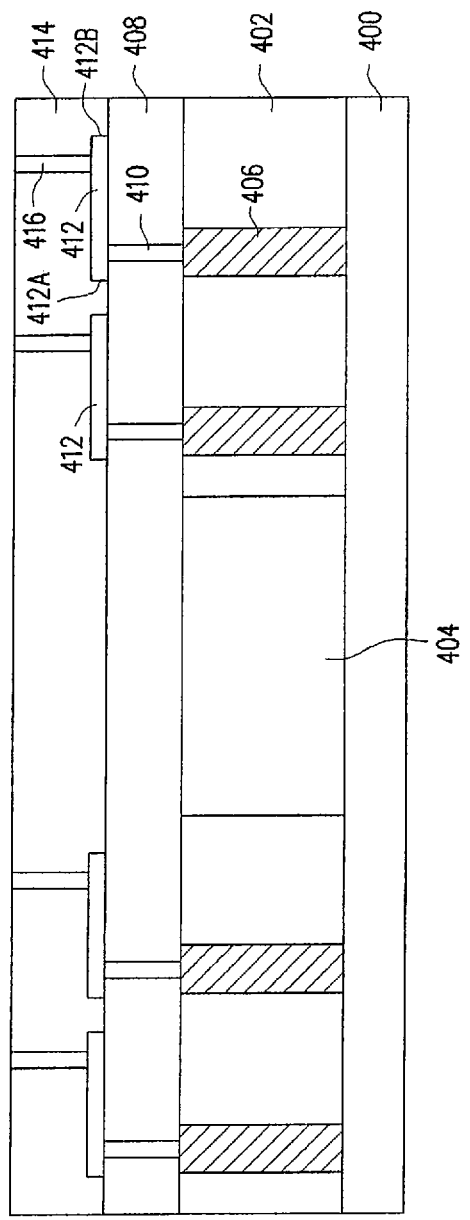

In FIG. 3, the method 300 continues to operation 316 in which a third plurality of vias 416 are formed in the second dielectric layer 404 (FIG. 4H). In some embodiments, as described above, the via 416 may be formed to be aligned with the end of the RDL 412 (e.g., 412B) that is opposite to the other end being aligned with the via 410, as illustrated in FIG. 4H. The via 416 may be formed of a conductive material, for example, copper (Cu), nickel (Ni), platinum (Pt), aluminum (Al), lead-free solder (e.g., SnAg, SnCu, SnAgCu), or a combination thereof. In some embodiments, the via 416 may be formed by using at least one of the following process steps: forming a fifth patterned mask layer over the second dielectric layer 414 that defines a dimension (e.g., a width of the via 416), and a location of the via 416 (e.g., to be aligned with the RDL 412 at the end 412B); using the fifth patterned mask layer to selectively etch the second dielectric layer 414 thereby forming a fourth plurality of openings in the second dielectric layer 414; filling the fourth plurality of openings with the conductive material as described above by using PVD, CVD, ECD, MBE, ALD, or the like; removing the fifth patterned mask layer; polishing out excessive conductive material on a top surface of the second dielectric layer 414; cleaning.

Figure 4I:
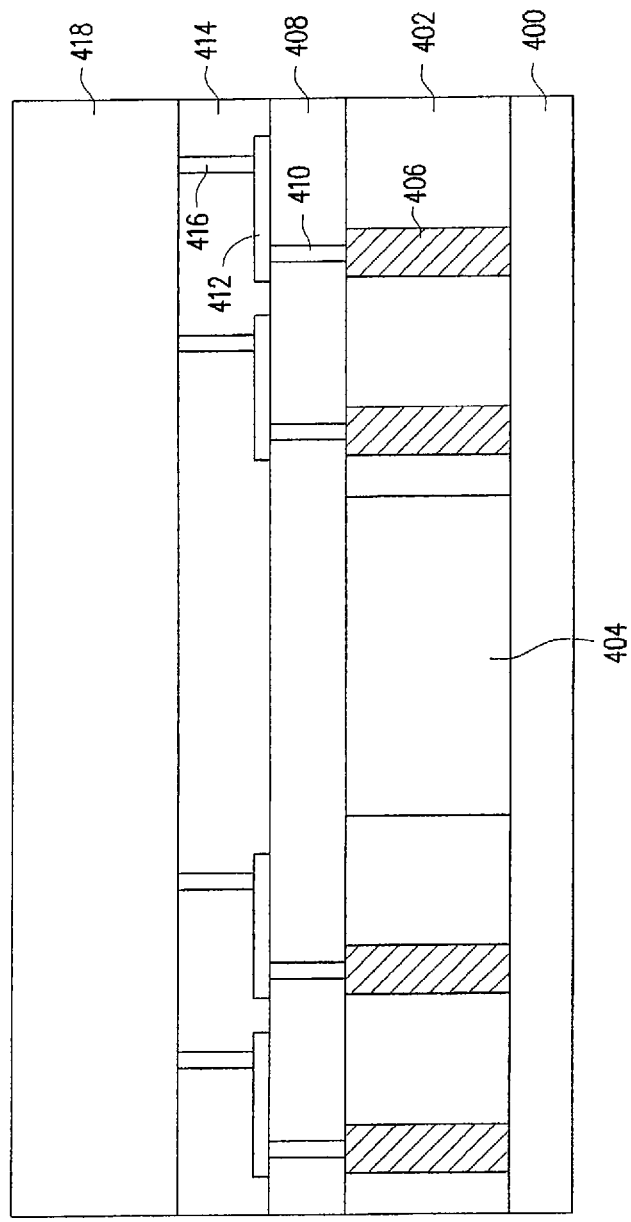

Referring back to FIG. 3, the method 300 continues to operation 318 in which a top tier 418 is formed over the second dielectric layer 414 (FIG. 4I). In some embodiments, the top tier 418 includes a molding material as described above (e.g., an epoxy molding compound (EMC) material, a molded underfill (MUF) material, an ammonium biflouride (ABF) material, an ABF-based material, a resin material, or a combination thereof). In some embodiments, such a molding material (i.e., the top tier 418) may be formed over the second dielectric layer 414 by a spin-on coating method, a deposition method (e.g., ALD, CVD, PVD), etc.

Figure 4J:
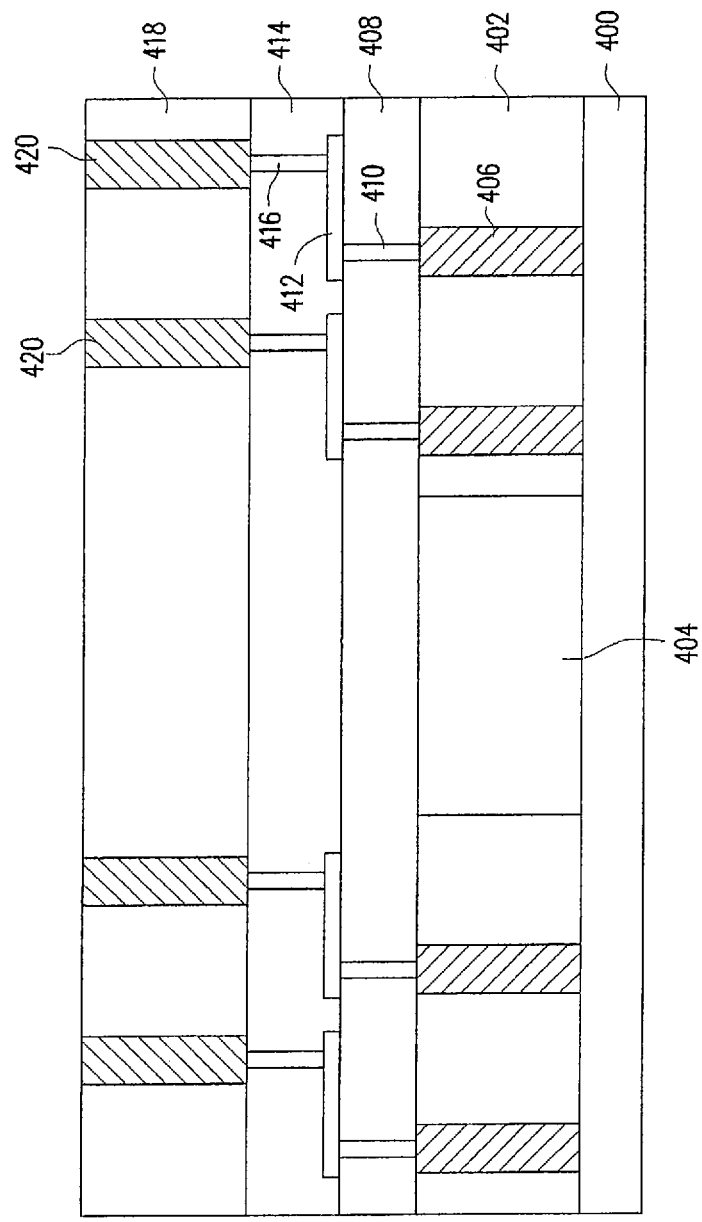
Figure 4K:
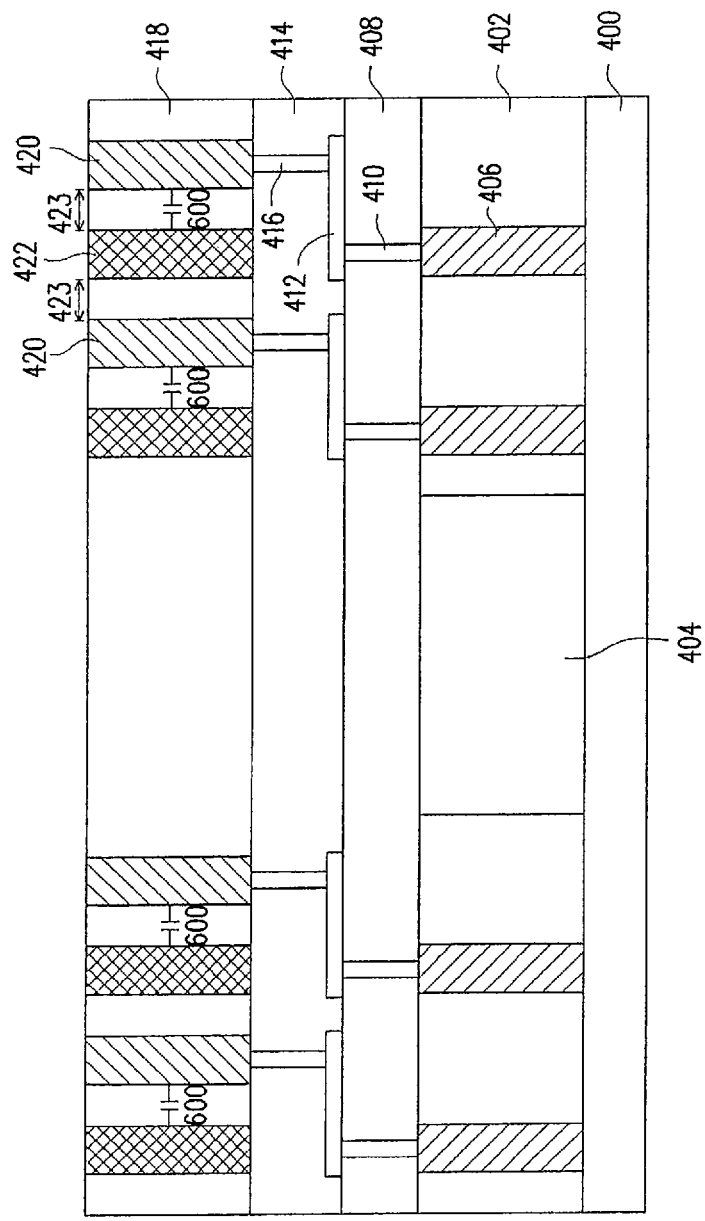

The method 300 continues to operation 320 in which fourth and fifth pluralities of vias 420 and 420 are formed in the top tier 418, as illustrated in FIGS. 4J and 4K, respectively. The vias 420 and 422 may be formed of a conductive material, for example, copper (Cu), nickel (Ni), platinum (Pt), aluminum (Al), lead-free solder (e.g., SnAg, SnCu, SnAgCu), or a combination thereof. In some embodiments, the via 420 is formed to be aligned with the via 416 (FIG. 4J), and the via 422 is formed to be spaced from the via 420 with a distance 423 (FIG. 4K). The distance 423 may be about 50~500 μm. The vias 422 may be formed prior to, simultaneously with, or subsequent to the formation of vias 420. In the example in which vias 420 and 422 are formed simultaneously, the vias 420 and 430 may be formed by using at least one of the following process steps: forming a sixth patterned mask layer over the top tier 418 that defines a respective dimension (e.g., a width of the via 420, a width of the via 422), and a respective location of the vias 420 and 422; using the sixth patterned mask layer to selectively etch the top tier 418 thereby forming a fifth plurality of openings in the top tier 418; filling the fifth plurality of openings with the conductive material as described above by using PVD, CVD, ECD, MBE, ALD, or the like; removing the sixth patterned mask layer; polishing out excessive conductive material on a top surface of the top tier 418; cleaning.

In some embodiments, referring now to FIG. 4K, each of the vias 420 is configured to be electrically coupled to the via 416 and RDL 412 in the second dielectric layer 414, the via 410 in the first dielectric layer 408, and further to the via 406 in the bottom tier 402. Further, as illustrated in FIG. 4K, since the via 410 in the first dielectric layer 408, and the RDL 412 and the via 416 in the second dielectric layer 414 are formed as a "step," the electrically coupled via 420, via 416, RDL 412, via 410, and via 406 may be formed as a step-like structure in accordance with various embodiments. More specifically, in some embodiments, the via 422 may be disposed between two adjacent vias 420, and spaced from each adjacent via 420 with the distance 423 that is about 50~500 μm.

Figure 5:
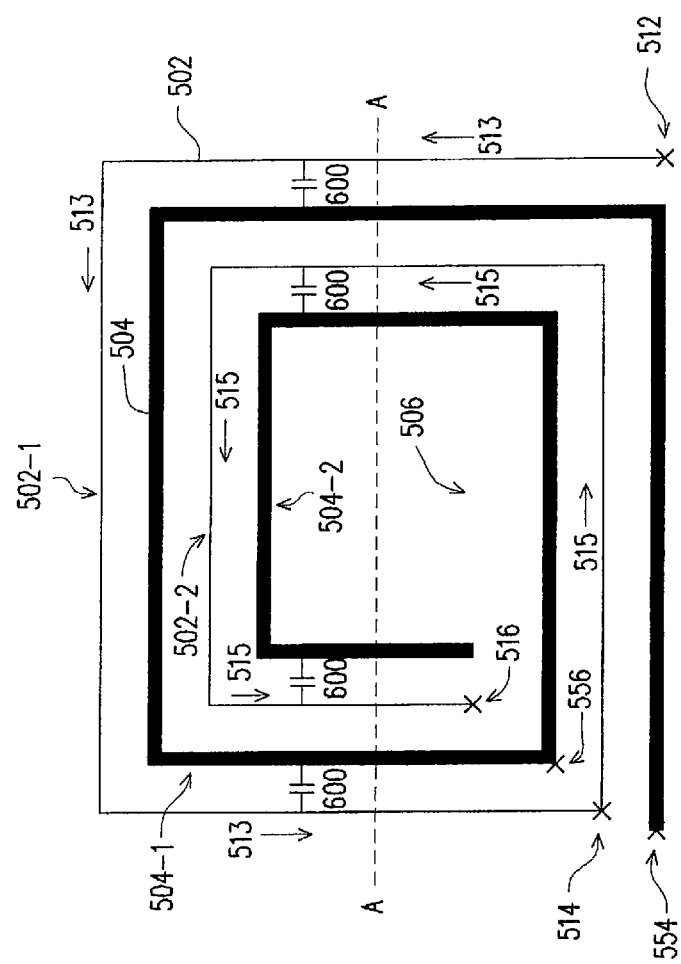
FIG. 5 illustrates an exemplary layout design, from a top view, of the coupling device of FIG. 2, in accordance with various embodiments.

FIG. 5 illustrates an exemplary layout design 500, from a top view, of the pluralities of vias 420 and 422 of the coupling device 124 in accordance with one embodiment. More specifically, the coupling device 124 of FIG. 2K is a cross-sectional view of the layout design 500 of FIG. 5 along line A-A. As shown in FIG. 5, from the top view, the plurality of vias 420 are formed as a first coil 502 and the plurality of vias 422 are formed as a second coil 504. That is, each of the pluralities of vias 420 and 422 shown in FIG. 2K may be coupled to one another to form routing conductive lines in one or more loops (or coils) having conductive turns as the coils 502 and 504, respectively, as shown in FIG. 5. Although the illustrated embodiment of FIG. 5 shows that the coils 502 and 504 are respectively formed as a rectangle-based shape, in some other embodiments, the coils 502 and 504 may be respectively formed as any of a variety of shapes such as, for example, a spiral loop while remaining within the scope of the present disclosure.

Referring still to FIG. 5, from the top view, the coils 502 and 504 are overlapped with each other so as to form a common lumen 506. In some embodiments, the coil 502 may be interweaved with the coil 504. More specifically in the illustrated embodiment of FIG. 5, from the top view, the coil 502 includes a plurality of conductive loops (502-1 and 502-2) that are continuously formed and coupled to each other. That is, the plurality of vias 420 are formed continuously as the conductive loops 502-1 and 502-2 (i.e., the coil 502), as shown in FIG. 5. Similarly, the coil 504 includes a plurality of conductive loops (504-1 and 504-2) that are continuously formed and coupled to each other. Similarly, the plurality of vias 422 are formed continuously as the conductive loops 504-1 and 504-2 (i.e., the coil 504), as shown in FIG. 5. For example, the first conductive loop 502-1 starts from point 512, along direction 513, to point 314, and the second conductive loop 502-2 that resumes at and starts from the point 514, along direction 515, to point 516. In some embodiment, a number of loops of a coil corresponds to a number of turns of the coil. Accordingly, the coil 502 in the illustrated embodiment of FIG. 5 has 2 turns while any desired number of turns may be used in some other embodiments. Since the coils 502 and 504 are formed interweavedly, the conductive loop 504-1 of the coil 504 may start from its own point 554, follow the similar direction 515, and stop at point 556 to form a loop and the loop 504-1 of coil 504 may be disposed between the loops 502-1 and 502-2 of the coil 502.

Referring back to FIG. 2K and in conjunction with FIG. 5, since each of the vias 420 at the top tier 418 is electrically coupled to its respective vias (416, 410, 406) and RDL 412, the coil 502 may include the electrically coupled vias 416, 410, and 406, and RDL's 412 in addition to the vias 420 at the top tier 418. In some embodiments, the coil 502 may define a inductor (hereinafter "inductor 502"). Similarly, the vias 422 that form the coil 504 may define a another inductor (hereinafter "inductor 504"). In some embodiments, inductor 502 may serve as the RI unit 126 of the coupling device 124 to magnetically resonate with the coupling device 106 of the transmitter 102 (FIG. 1). That is, the inductor 502 may be configured to be used in the near-field application of the wireless power transfer system 100. On the other hand, while the inductors 502 and 504 resonate with each other, together with an effectively induced capacitor 600 between the via of the coil 502 (i.e., via 420) and the via of the coil 504 (i.e., via 422) (as illustrated in FIGS. 2K and 5), an antenna loop may be formed. Such an antenna loop may include an LC resonant network. In some embodiments, the antenna loop may serve as the antenna unit 128 of the coupling device 124 to couple with the coupling device 106 of the transmitter 102 (FIG. 1) by means of electromagnetic radiation. In other words, the inductors 502 and 504, and the capacitor 600 (i.e., the formed antenna loop) may be configured to be used in the far-field application of the wireless power transfer system 100. As such, by fabricating the coupling device 124 in accordance with disclosed embodiments of FIG. 3, the coupling device 124 may be used in both the near-field and far-field applications.

Figure 6:
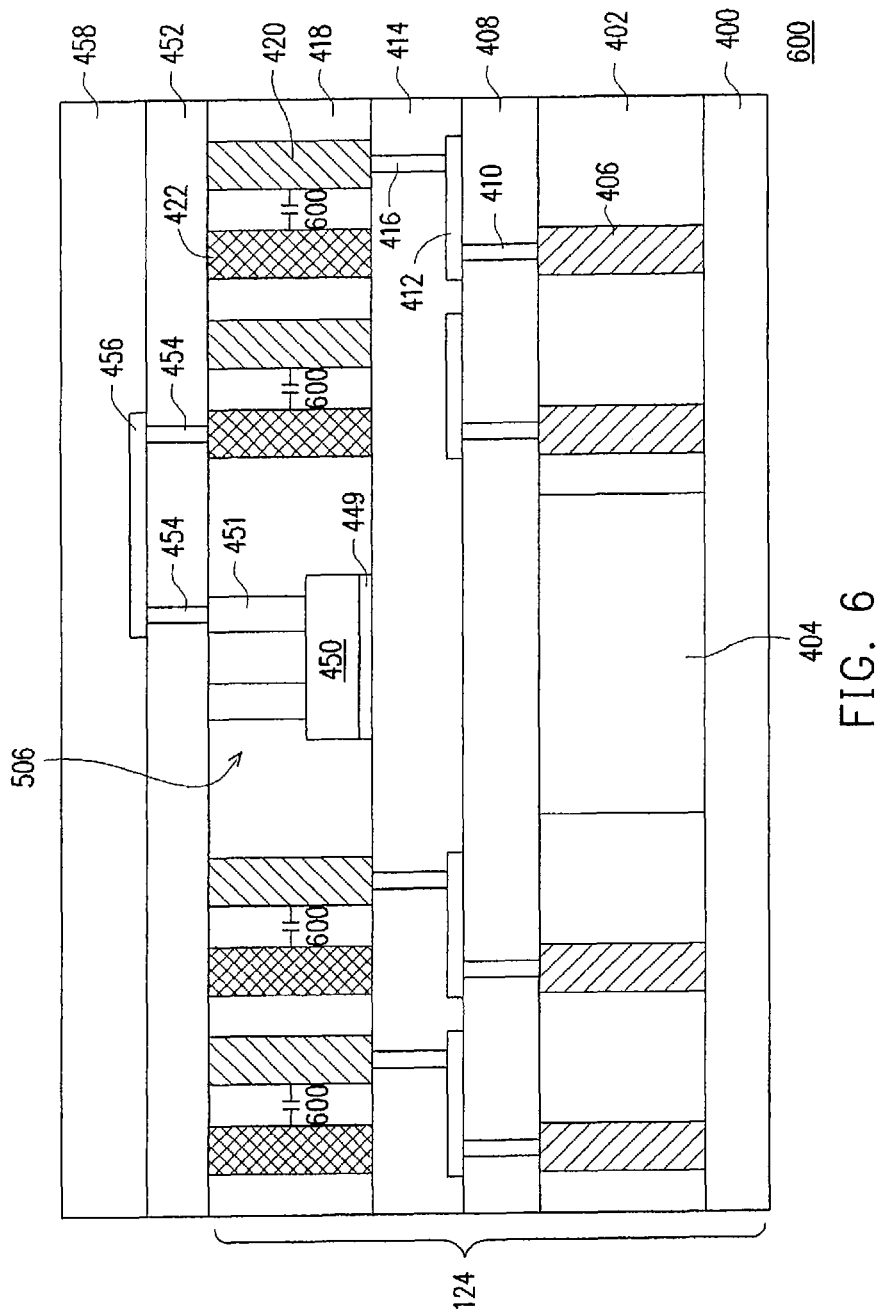
FIG. 6 illustrates an exemplary layout design, from a cross-sectional view, of an integrated fan-out (InFO) structure that includes the coupling device of FIG. 2, in accordance with various embodiments.

As described above, in some embodiments, the wireless power transfer system 100 (FIG. 1) may be formed in an InFO structure. FIG. 6 illustrates an exemplary InFO structure 600 that includes the coupling device 124 of the power transfer system 100. In the illustrated embodiment of FIG. 6, the InFO structure 600 includes, in addition to the coupling device 124 as shown in FIG. 2K, an integrated circuit (IC) die 450 disposed around the lumen area 506. Although only one IC die is shown in the illustrated embodiment of InFO structure 600, the InFO structure 600 may include any desired number of IC dies disposed in the lumen area 506 while remaining within the scope of the present disclosure. Such an IC die (e.g., 450) may include a microcontroller, a charging device, an energy harvester, or a combination thereof. Moreover, the InFO structure 600 further includes a dielectric layer 452, a plurality of vias 454 disposed within the dielectric layer 452, an RDL 456 disposed over the dielectric layer 452, and another dielectric layer 458 disposed over the dielectric layer 452. In some embodiments, the IC die 450 is (electrically) coupled to the one of the vias 454 through IC die 450's electrical contact 451, the vias 454 are (electrically) coupled to the RDL 456, the RDL 456 is (electrically) coupled to the of the vias 422, as shown in FIG. 6. As such, the IC die 450 is electrically coupled to the via 422. Although in the illustrated embodiment of FIG. 6 the IC die 450 is shown as being coupled to one of the vias 422, as described above, the IC die 450 is electrically coupled to the coil 504 (since the plurality of vias 422 are electrically coupled to one another as the coil 504). Moreover, while the coupling device 124 uses the antenna unit 128 in the far-field application (i.e., the antenna loop being formed by the coils 502 and 504, and the capacitor 600), the IC die 450 is also electrically coupled to the antenna loop. In the example of the IC die 450 being implemented as an energy harvester, in some embodiments, the antenna unit 128 may use the formed antenna loop to collect any of a variety of ambient energy near coupling device 124 such as, for example, solar power, thermal energy, microwaves, etc., and transfer the collected energy to the coupled energy harvester 450 for storage and/or use.

In some embodiments, the dielectric layers 452 and 458 may be each formed of a material that is selected from: a polymide, a polybenzoxazole (PBO), a PBO-based dielectric material, a benzocyclobutene (BCB), a BCB-based dielectric material, or a combination thereof. The vias 454 and RDL 456 may be each formed of a conductive material, for example, copper (Cu), nickel (Ni), platinum (Pt), aluminum (Al), lead-free solder (e.g., SnAg, SnCu, SnAgCu), or a combination thereof. In some embodiments, the IC die 450 may be disposed on (attached to) the dielectric layer 414 through an adhesive layer 449 (e.g., a die attach film (DAF)) before the top tier 418 is formed over the dielectric layer 414 (i.e., before the operation 318 of FIG. 3). Following the top tier 418 being formed (i.e., operation 318 of FIG. 3) and the vias 420 and 422 being formed therein (i.e., operation 320 of FIG. 3), the dielectric layer 452 may be formed over the top tier 418 using the similar process as described in operations 308 and 314, the vias 454 are then formed in the dielectric layer 452 using the similar process as described in operations 310 and 320, the RDL 456 is formed to (electrically) couple the vias 454 using the similar process as described in operation 312, and the dielectric layer 458 is formed over the dielectric layer 452 using the similar process described in operations 308 and 314.

In an embodiment, a semiconductor device is disclosed. The semiconductor device includes a first molding layer; a second molding layer formed over the first molding layer; a first conductive coil including a first portion continuously formed in the first molding layer and a second portion continuously formed in the second molding layer, wherein the first and the second portions are laterally displaced from each other; and a second conductive coil formed in the second molding layer, wherein the second conductive coil is interweaved with the second portion of the first conductive coil in the second molding layer.

In another embodiment, a semiconductor includes a first molding layer; a second molding layer formed over the first molding layer; a first conductive coil including a first portion continuously formed in the first molding layer and a second portion continuously formed in the second molding layer, wherein the first and the second portions are laterally displaced from each other and electrically coupled to each other with a conductive line that is laterally disposed between the first and second molding layers; and a second conductive coil formed in the second molding layer, wherein the second conductive coil is interweaved with the second portion of the first conductive coil in the second molding layer.

Yet in another embodiment, a method making a semiconductor device includes forming a first via in a first molding layer; forming a conductive line over the first molding layer, wherein the conductive line is laterally disposed over the first molding layer and a first end of the conductive line aligns with the first via; and forming a third via and a fourth via in a second molding layer that is over conductive line and the first molding layer, wherein the third via aligns with a second end of the conductive line, wherein the third via is spaced from the fourth via, and wherein the third via, the conductive line, and the first via are electrically coupled to one another.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising:

forming a first molding layer on a substrate;

forming a first plurality of vias in the first molding layer;
forming a first conductive line over the first molding layer, wherein the first conductive line is laterally disposed over the first molding layer and a first end of the conductive line aligns with and is electrically coupled to a first via of the first plurality of vias;
forming a second molding layer above the first molding layer;
forming a second plurality of vias in the second molding layer, wherein a second via of the second plurality of vias aligns with and is electrically coupled to a second end of the first conductive line, and wherein the second plurality of vias, the conductive line, and the first plurality of vias are electrically coupled to one another, wherein the second plurality of vias form a first conductive coil;
forming a third plurality of vias in the second molding layer, wherein the third plurality of vias form a second conductive coil interweaved with the first conductive coil; and
forming an integrated circuit die in the second molding layer and electrically coupling the integrated circuit die to the second conductive coil.

2. The method of claim 1, further comprising:
forming a high-impedance dummy layer in the first molding layer.

3. The method of claim 1, further comprising:
forming a first dielectric layer over the first molding layer, wherein the first dielectric layer is disposed between the first and second molding layers; and
forming a fourth via in the first dielectric layer, wherein the fourth via electrically couples the first plurality of vias to the first conductive line.

4. The method of claim 3, further comprising:
forming a second dielectric layer over the first dielectric layer and the first conductive line, wherein the first and second dielectric layers are sandwiched between the first and second molding layers; and
forming a fifth via in the second dielectric layer, wherein the fifth via electrically couples the integrated circuit die to the third plurality of vias.

5. The method of claim 3, wherein the integrated circuit die is disposed in a lumen area of the first and second conductive coils.

6. The method of claim 5, wherein the integrated circuit die is attached to a top surface of the first dielectric layer.

7. The method of claim 6, wherein the integrated circuit die comprises an energy harvester.

8. The method of claim 6, wherein an induced capacitor is formed between the first and second conductive coils, and wherein the induced capacitor and the first and second conductive coils form an antenna loop.

9. The method of claim 6, further comprising:
forming a third dielectric layer over the second molding layer;
forming sixth and seventh vias in the third dielectric layer, the sixth via being electrically coupled to the IC device and the seventh via being electrically coupled to the third plurality of vias; and
forming a second conductive line above the third dielectric layer, wherein a first end of the second conductive line is electrically coupled to the sixth via and second end, opposite the first end, of the second conductive line is electrically coupled to the seventh via.

10. The method of claim 9, further comprising forming a fourth dielectric layer over the third dielectric layer and the second conductive line.

11. A method of making a semiconductor device, comprising:
providing a substrate;
forming a first molding layer on the substrate;
forming a first plurality of vias in the first molding layer;
forming a first conductive line over the first molding layer, wherein the first conductive line is laterally disposed over the first molding layer and a first end of the conductive line aligns with and is electrically coupled to at least one of the first plurality of vias;
forming a first dielectric layer over the first molding layer;
forming a first via in the first dielectric layer, wherein the first via electrically couples the first plurality of vias to the first conductive line;
forming a second molding layer above the first dielectric layer;
forming a second plurality of vias in the second molding layer, wherein at least one of the second plurality of vias aligns with and is electrically coupled to a second end of the conductive line, and wherein the second plurality of vias, the first conductive line, and the first plurality of vias are electrically coupled to one another, wherein the second plurality of vias form a first conductive coil;
forming a third plurality of vias in the second molding layer, wherein the third plurality of vias form a second conductive coil interweaved with the first conductive coil; and
forming an integrated circuit die in the second molding layer and electrically coupling the integrated circuit die to the second conductive coil.

12. The method of claim 11, further comprising:
forming a high-impedance dummy layer in the first molding layer.

13. The method of claim 11, further comprising:
forming a second dielectric layer over the first dielectric layer and the first conductive line, wherein the first and second dielectric layers are sandwiched between the first and second molding layers; and
forming a fourth via in the second dielectric layer, wherein the fourth via electrically couples the first conductive line to the second plurality of vias.

14. The method of claim 11 further comprising:
forming a third dielectric layer over the second molding layer; and
forming a fifth via in the third dielectric layer, wherein the fifth via electrically couples the integrated circuit die to the third plurality of vias.

15. The method of claim 14, wherein the integrated circuit die comprises an energy harvester.

16. A method of making a semiconductor device, comprising:
providing a substrate;
forming a first molding layer on the substrate;
forming a first plurality of vias in the first molding layer;
forming a first dielectric layer over the first molding layer;
forming a first via in the first dielectric layer,
forming a first conductive line over the first molding layer, wherein the first conductive line is laterally disposed over the first molding layer and a first end of the conductive line aligns with and is electrically coupled to at least one of the first plurality of vias, wherein the first via electrically couples the first plurality of vias to the first conductive line;
forming a second dielectric layer over the first dielectric layer and the first conductive line;
forming a second via in the second dielectric layer;

forming a second molding layer above the second dielectric layer;

forming a second plurality of vias in the second molding layer, wherein the second plurality of vias is electrically coupled to a second end of the first conductive line, and wherein the second via electrically couples the second plurality of vias, the first conductive line, and the first plurality of vias to one another, wherein the second plurality of vias form a first conductive coil;

forming a third plurality of vias in the second molding layer, wherein the third plurality of vias form a second conductive coil interweaved with the first conductive coil; and forming an integrated circuit die in the second molding layer and electrically coupling the integrated circuit die to the second conductive coil.

17. The method of claim 16, further comprising:

forming a high-impedance dummy layer in the first molding layer.

18. The method of claim 16 further comprising:

forming a third dielectric layer over the second molding layer; and forming a fourth via in the third dielectric layer, wherein the fourth via electrically couples the integrated circuit die to the third plurality of vias.

19. The method of claim 18, wherein the integrated circuit die comprises an energy harvester.

20. The method of claim 19, wherein an induced capacitor is formed between the first and second conductive coils, and wherein the induced capacitor and the first and second conductive coils form an antenna loop.

* * * * *